(12) United States Patent  
Yen et al.

(10) Patent No.: US 8,502,338 B2  
(45) Date of Patent: Aug. 6, 2013

(54) THROUGH-SUBSTRATE VIA WAVEGUIDES

(75) Inventors: Hsiao-Tsung Yen, Tainan (TW); Hsien-Pin Hu, Zhubei (TW); Chin-Wei Kuo, Zhubei (TW); Sally Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 330 days.

(21) Appl. No.: 12/878,803

(22) Filed: Sep. 9, 2010

(65) Prior Publication Data

US 2012/0061795 A1 Mar. 15, 2012

(51) Int. Cl.  
*H01L 29/00* (2006.01)

(52) U.S. Cl.  
USPC .... 257/508; 257/503; 257/698; 257/E23.067; 257/E23.174

(58) Field of Classification Search  
USPC .......... 257/503, 508, 520, 698, 774, E23.067, 257/E23.144, E23.174  
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,677,657 B2 * | 1/2004 | Gardes .......................... 257/488 |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |

(Continued)

FOREIGN PATENT DOCUMENTS

CN 101556944 A 10/2009

*Primary Examiner* — Matthew E Warren  
(74) *Attorney, Agent, or Firm* — Slater & Matsil, L.L.P.

(57) ABSTRACT

A device includes a semiconductor substrate of a first conductivity type, wherein the semiconductor substrate comprises a first surface and a second surface opposite the first surface. A through-substrate via (TSV) extends from the first surface to the second surface of the semiconductor substrate. A well region of a second conductivity type opposite the first conductivity type encircles the TSV, and extends from the first surface to the second surface of the semiconductor substrate.

11 Claims, 7 Drawing Sheets

U.S. PATENT DOCUMENTS

| | | |
|---|---|---|
| 7,335,972 B2 | 2/2008 | Chanchani |
| 7,355,273 B2 | 4/2008 | Jackson et al. |
| 7,843,064 B2 | 11/2010 | Kuo et al. |
| 8,093,677 B2 * | 1/2012 | Stecher et al. ............... 257/508 |
| 8,164,113 B2 * | 4/2012 | Lin et al. ...................... 257/173 |
| 2011/0304010 A1 * | 12/2011 | Jiang et al. ................... 257/528 |

* cited by examiner

THROUGH-SUBSTRATE VIA WAVEGUIDES

TECHNICAL FIELD

This disclosure relates generally to integrated circuit devices, and more particularly to through-substrate via (TSV) waveguides and methods of forming the same.

BACKGROUND

To stack multiple dies in a same package structure, through-substrate vias (TSVs) are used to route signals from one side of a die to the opposite side. FIG. 1 illustrates a cross-sectional view of conventional TSV 102 formed in semiconductor substrate 106. Isolation layer 104 is formed between TSV 102 and semiconductor substrate 106. It is observed that capacitor 108 is formed, with TSV 102 and semiconductor substrate 106 acting as the capacitor plates of capacitor 108, and isolation layer 104 acting as the capacitor insulator.

The TSV structure as shown in FIG. 1 suffers from drawbacks. Due to the relatively great size of TSV 102, the capacitance of capacitor 108 is high. This causes several problems. First, the noise in substrate 106 may be easily coupled into TSV 102. Second, when high-frequency signals are conducted through TSV 102, the high-frequency signals may be easily lost to semiconductor substrate 106 due to the coupling between TSV 102 and semiconductor substrate 106.

SUMMARY

In accordance with one aspect, a device includes a semiconductor substrate of a first conductivity type, wherein the semiconductor substrate comprises a first surface and a second surface opposite the first surface. A through-substrate via (TSV) extends from the first surface to the second surface of the semiconductor substrate. A well region of a second conductivity type opposite the first conductivity type encircles the TSV, and extends from the first surface to the second surface of the semiconductor substrate.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A through-substrate via (TSV) waveguide and the method of forming the same are provided. The intermediate stages in the manufacturing of embodiments are illustrated. The variations of the embodiments are discussed. Throughout the various views and illustrative embodiments, like reference numbers are used to designate like elements.

Figure 1:
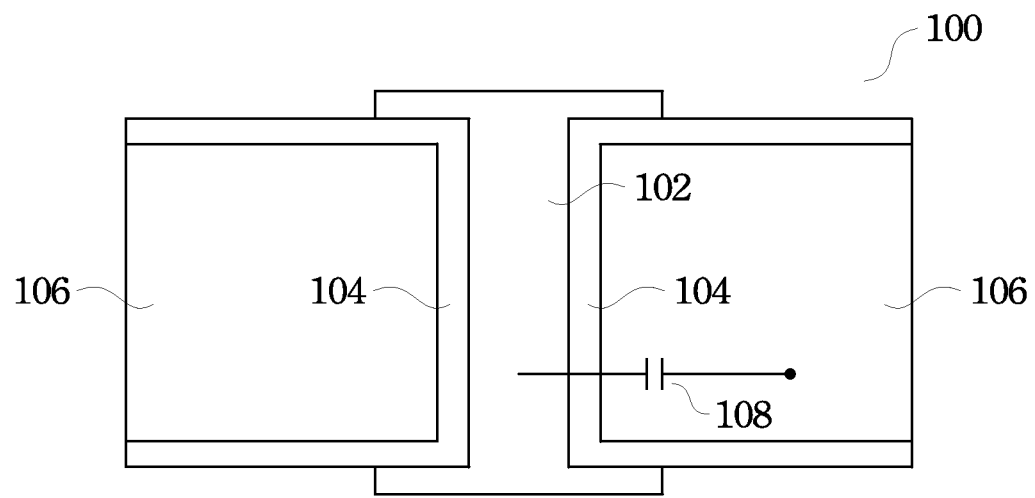
FIG. 1 illustrates a cross-sectional view of a conventional through-substrate via (TSV)
Figure 2:
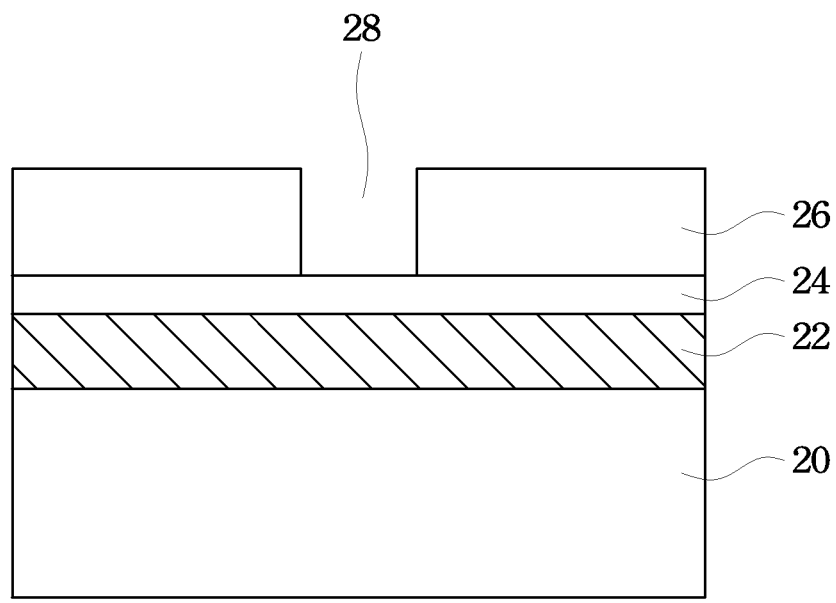
FIGS. 2 through 7 are cross-sectional views and a top view of intermediate stages in the manufacturing of a TSV-based waveguide in accordance with an embodiment, wherein an n-well region is formed as a shield.

Referring to FIG. 2, semiconductor substrate 20 is provided. In an embodiment, semiconductor substrate 20 includes silicon. Other commonly used materials, such as carbon, germanium, gallium, arsenic, nitrogen, indium, phosphorus, and/or the like, may also be included in semiconductor substrate 20. Semiconductor substrate 20 may be formed of a single-crystalline or a compound semiconductor material, and may be a bulk substrate or a semiconductor-on-insulator (SOI) substrate. In an embodiment, semiconductor substrate 20 is a p-type substrate doped with a p-type impurity, for example, with an impurity concentration lower than about $1E10/cm^3$, although it may also be an n-type substrate. Integrated circuits such as transistors (not shown) may be formed at a surface of semiconductor substrate 20.

Pad layer 22 and mask layer 24 are formed on semiconductor substrate 20. Pad layer 22 is a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography process. Photo resist 26 is formed on mask layer 24 and is then patterned, forming opening 28 in photo resist 26.

Figure 3:
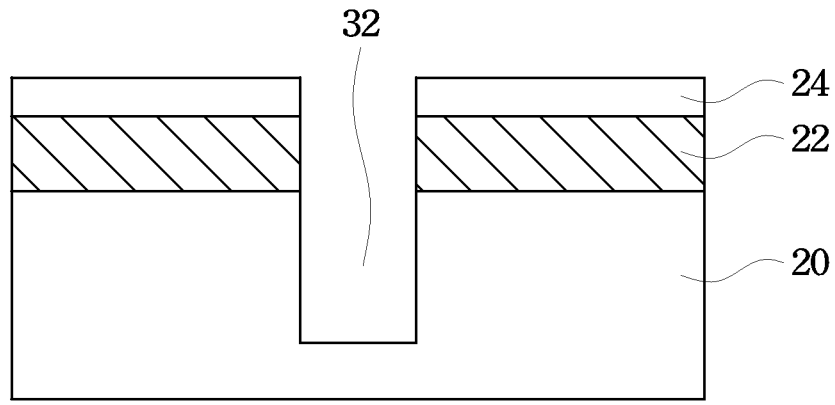

Referring to FIG. 3, mask layer 24 and pad layer 22 are etched through opening 28, exposing underlying semiconductor substrate 20. The exposed semiconductor substrate 20 is then etched, forming TSV opening 32. Photo resist 26 is then removed.

Figure 4A:
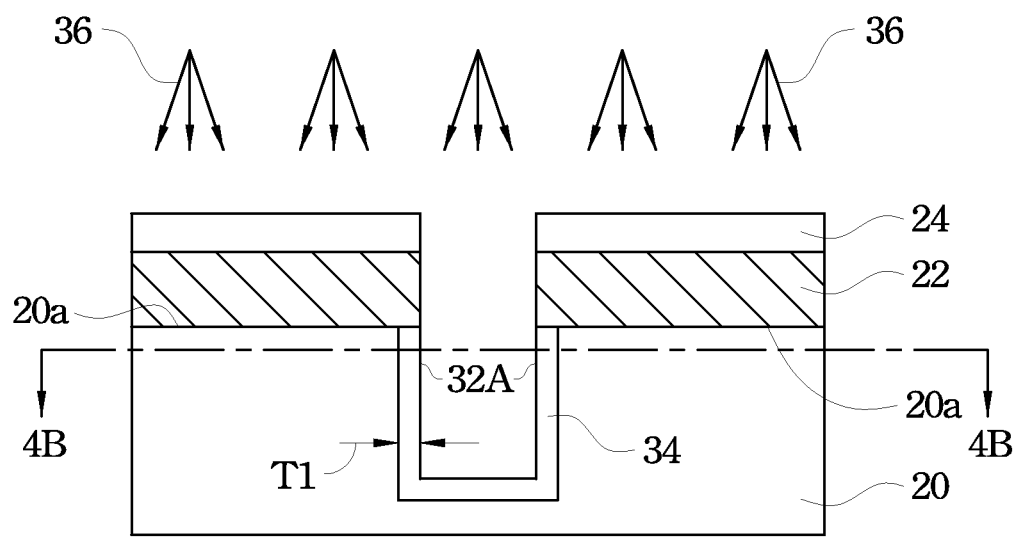
Figure 4B:
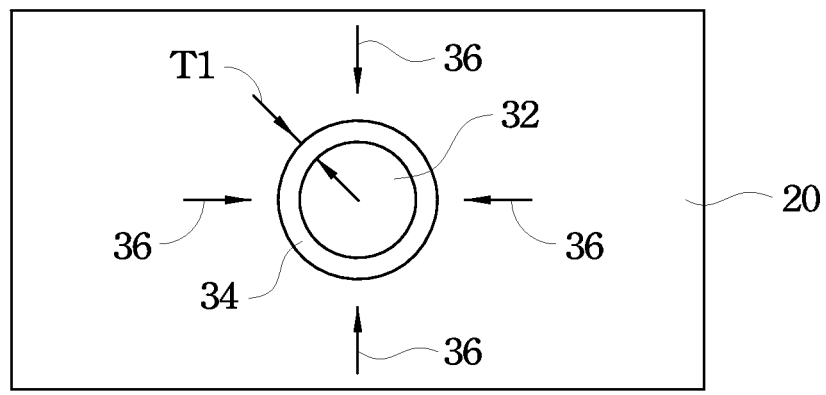

Referring to FIGS. 4A and 4B, tilt implantation (symbolized by arrows) are performed to implant an n-type impurity into sidewall portions of semiconductor substrate 20 that are exposed to TSV opening 32. At the time the tilt implantation is performed, top surface 20a of semiconductor substrate 20 is covered by pad layer 22 and mask layer 24. N-well region 34 is formed to encircle TSV opening 32, and extends from sidewall(s) 32A into semiconductor substrate 20. Thickness T1 of n-well region 34 may be between about 300 nm and about 1,000 nm. It is realized, however, that the values recited throughout the description are merely examples, and may be changed if different formation technologies are used. The n-type impurity may include phosphorous, arsenic, antimony, and combinations thereof. The n-type impurity concentration of n-well region 34 may be greater than about $1E12/cm^3$, or even greater than abut $1E14/cm^3$.

FIG. 4B illustrates a top view of the structure as shown in FIG. 4A, wherein the top view is obtained in a plane crossing line 4B-4B in FIG. 4A. Arrows 36 illustrate the tilt directions of the tilt implantations. In an embodiment, the tilt implantations include four tilt implantation steps, each tilt toward one direction. In alternative embodiments, the tilt implantations may include three, or more than four, tilt implantation steps, each tilting toward a direction different from others. Accordingly, thicknesses T1 measured from different parts of n-well region 34 are substantially uniform, for example, with the difference between any two parts of n-well region 34 having a difference less than 50 percent, or even less than 20 percent, of the thicknesses of the two parts.

Figure 5:
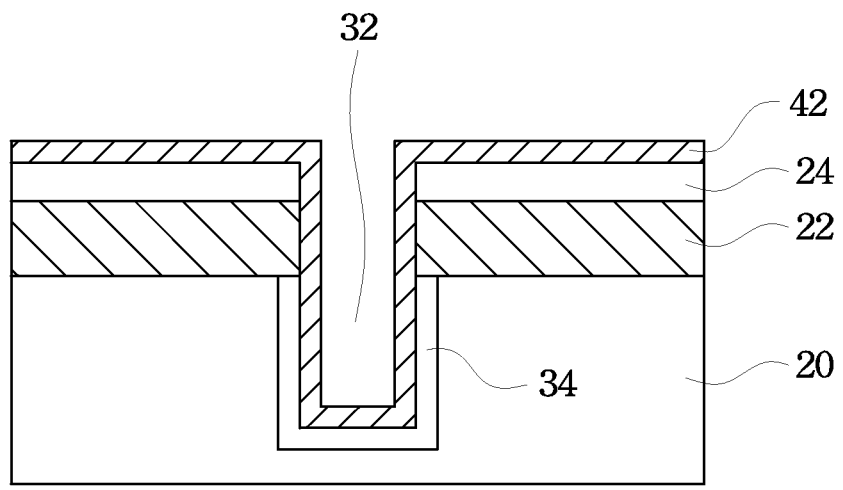

Isolation layer 42 is then formed in TSV opening 32, as is shown in FIG. 5. In an embodiment, isolation layer 42 is formed using a deposition technique that can form conformal dielectric layers, such as selective area chemical vapor deposition (SACVD), high aspect ratio process (HARP), or the like. Isolation layer 42 may include silicon nitride, silicon oxide, silicon oxynitride, or the like. Alternatively, isolation layer 42 may be formed of a thermal oxide. In yet other embodiments, isolation layer 42 is formed using in-situ steam generation (ISSG).

Figure 6:
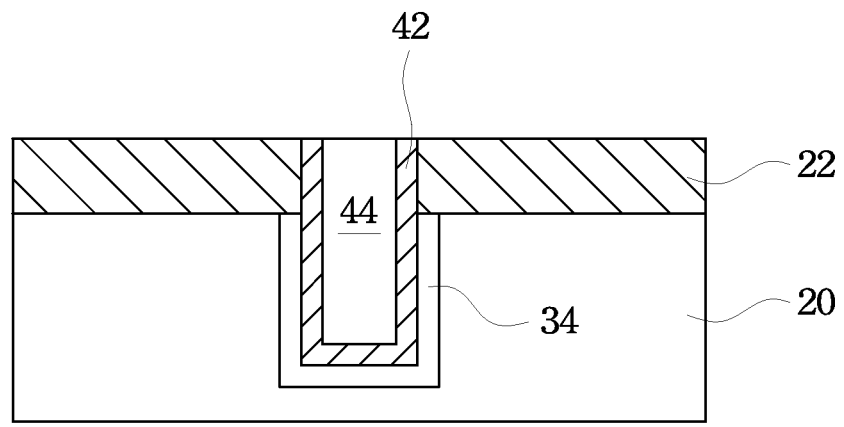

Referring to FIG. 6, TSV opening 32 is filled with a metallic material, forming TSV 44. The metallic material may include copper, tungsten, aluminum, alloys thereof, and multi-layers thereof. Mask layer 24, and possibly pad layer 22, may then be removed.

Figure 7:
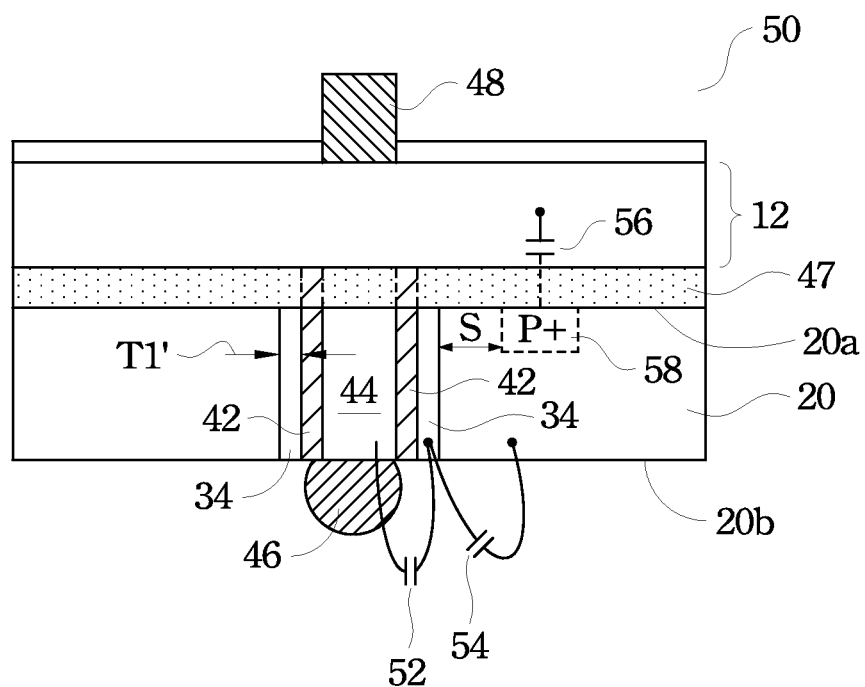

Referring to FIG. 7, in subsequent process steps, the backside of semiconductor substrate 20 is grinded until TSV 44 is exposed. Metal bump 46, which may be a solder bump, is formed on the backside of substrate 20, and electrically coupled to TSV 44. FIG. 7 also illustrates the respective chip 50 in which TSV 44 is located. Chip 50 may be a portion of an un-sawed wafer, or a chip sawed from a wafer. Further, metal bump 48 may be formed on the front side of chip 50. It is observed that n-well region 34, which has a shape of a ring (a pipe) encircling TSV 44 and isolation layer 42, extends from front surface 20a to back surface 20b of semiconductor substrate 20. In various embodiments, TSV 44 may further extend into interlayer dielectric (ILD) 47, although n-well region 34 is limited in semiconductor substrate 20.

It is noted that before (or even after) chip 50 is sawed from the respective wafer, various thermal processes may occur, which cause the diffusion of the n-type impurity in n-well region 34 farther into semiconductor substrate 20. In the final structure after metal bumps 46 and 48 are formed, the n-type impurity concentration of n-well region 34 may still be greater than about $1E12/cm^3$, or even greater than abut $1E14/cm^3$, and thickness T1' of n-well region 34 may be between about 300 and about 1 µm, for example.

In an embodiment, semiconductor substrate 20 is electrically grounded. Accordingly, TSV 44 and n-well region 34 form capacitor 52, and n-well region 34 and p-type semiconductor substrate 20 form junction capacitor 54. Capacitors 52 and 54 are connected in series for signals or noises coupled between TSV 44 and semiconductor substrate 20. As a result, the equivalent capacitance of capacitors 52 and 54 in combination is smaller than the capacitance between TSV 44 and semiconductor substrate 20 assuming no n-well region 34 is formed. With reduced capacitance, the signal and noise coupling between TSV 44 and semiconductor substrate 20 is also reduced.

In alternative embodiments, semiconductor substrate 20 is electrically floating (not grounded). Capacitor 56 may further be formed in chip 50 and connected in series with capacitors 52 and 54. Capacitor 56 may be formed of varactors, metal-insulator-metal (MIM) capacitors, metal-oxide-metal (MOM) capacitors, or any other known capacitors that may be formed in chips. Capacitor 56 may be connected to capacitor 54 through heavily doped p-type region (P+) region 58 that is formed in semiconductor substrate 20, for example. Distance S between P+ region 58 and n-well region 34 may be less than about 1 µm, for example, so that capacitor 56 is effectively coupled to capacitors 52 and 54. Again, the equivalent capacitance of capacitances 52, 54, and 56 in combination is smaller than the capacitance between TSV 44 and semiconductor substrate 20 assuming no n-well region 34 is formed, and hence the signal and noise coupling between TSV 44 and semiconductor substrate 20 is also reduced.

Figure 8:
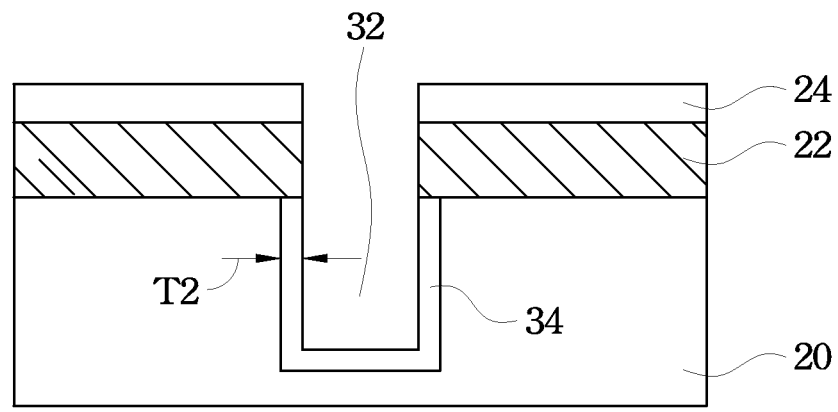
FIGS. 8 through 11 are cross-sectional views and a top view of intermediate stages in the manufacturing of a TSV-based waveguide in accordance an alternative embodiment, wherein a p-well region and an n-well region are formed as shields.

FIGS. 8 through 11 illustrate the formation of a TSV waveguide in accordance with an alternative embodiment. Unless specified otherwise, the reference numerals in these embodiments represent like elements as in the embodiments illustrated in FIGS. 2 through 7. The initial steps of these embodiments are essentially the same as shown in FIGS. 2 through 4B. Referring to FIG. 8, after the tilt implantations to form n-well region 34, an optional thermal anneal may be performed to diffuse n-well region 34 farther into semiconductor substrate 20 to depth/thickness T2. Alternatively, no thermal anneal is performed. Next, as shown in FIG. 9A, a tilt implantation (symbolized by arrows 61) is performed to implant a p-type impurity into sidewall portions of semiconductor substrate 20 that are exposed to TSV opening 32. At the time the tilt implantations are performed, the top surface of semiconductor substrate 20 is covered by pad layer 22 and mask layer 24. As a result, p-well region 60 is formed encircling TSV opening 32, and extends from sidewalls 32A of TSV opening 32 into semiconductor substrate 20. Depth/thickness T3 of p-well region 60 is smaller than depth/thickness T2 of n-well region 34, and thickness T3 may be between about 30 percent and about 80 percent of thickness T2. This may be achieved, for example, by adjusting the implantation energies for forming n-well region 34 and p-well region 60. The p-type impurity concentration in p-well region 60 may be greater than about $1E12/cm^3$, and may even be greater than about $1E14/cm^3$.

Figure 9A:
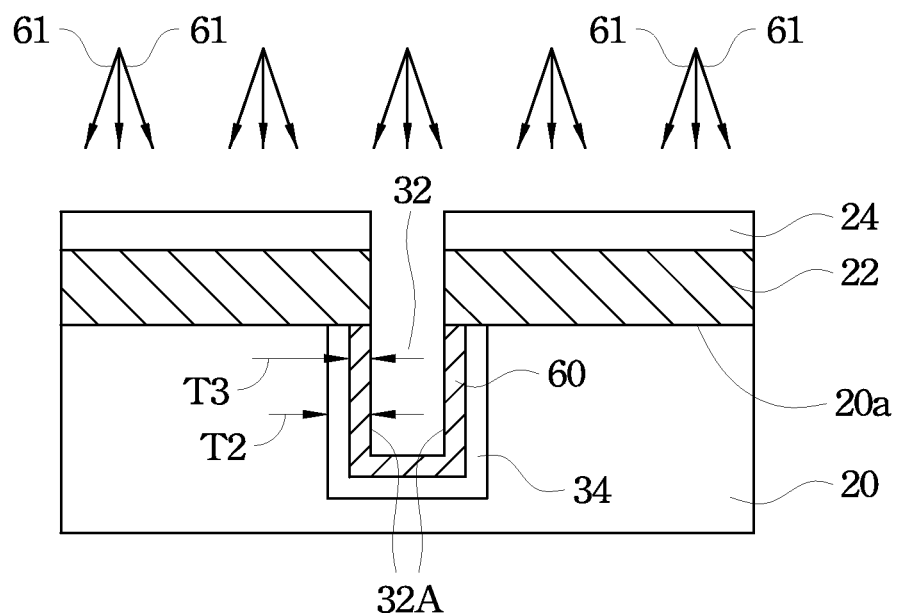
Figure 9B:
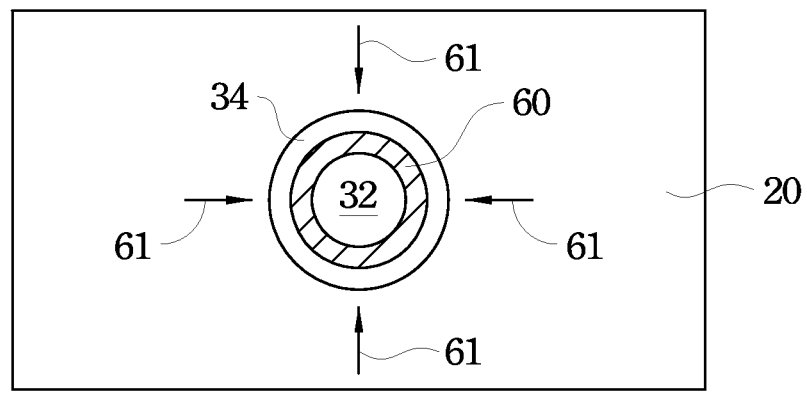
Figure 10:
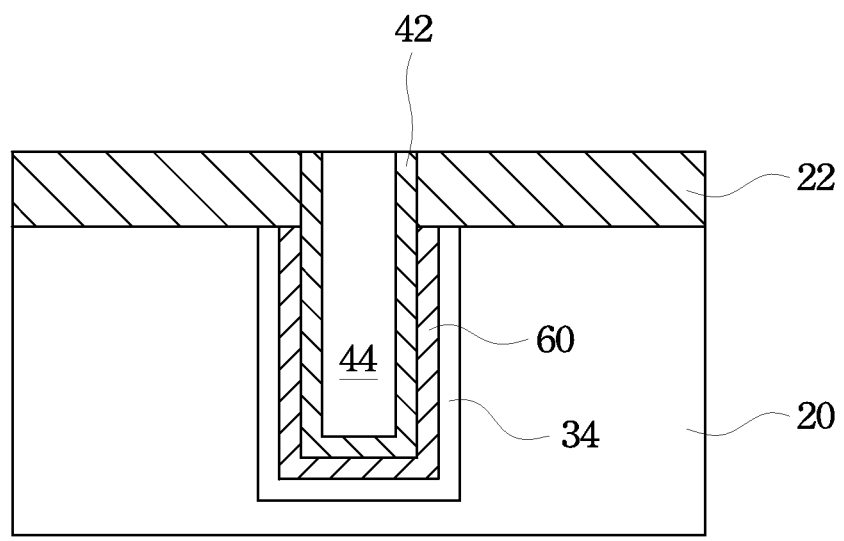

FIG. 9B illustrates a top view of the structure as shown in FIG. 9A, wherein pad layer 22 and the mask layer 24 are not shown in the top view. In an embodiment, the tilt implantation (arrows 61) of the p-type impurity also includes four tilt implantation steps, each tilting toward one direction, although different numbers of tilt implantations may be used. In the resulting structure, the p-type impurity neutralizes a portion of n-type impurity, with the net concentration being of p-type. The resulting p-type well region 60 thus extends from surface 32A of semiconductor substrate 20 exposed to TSV opening 32 into semiconductor substrate 20. The un-neutralized portion of n-well region 34 is between, and contacting, p-well region 60 and semiconductor substrate 20. Next, as shown in FIG. 10, isolation layer 42 and TSV 44 are formed.

Figure 11:
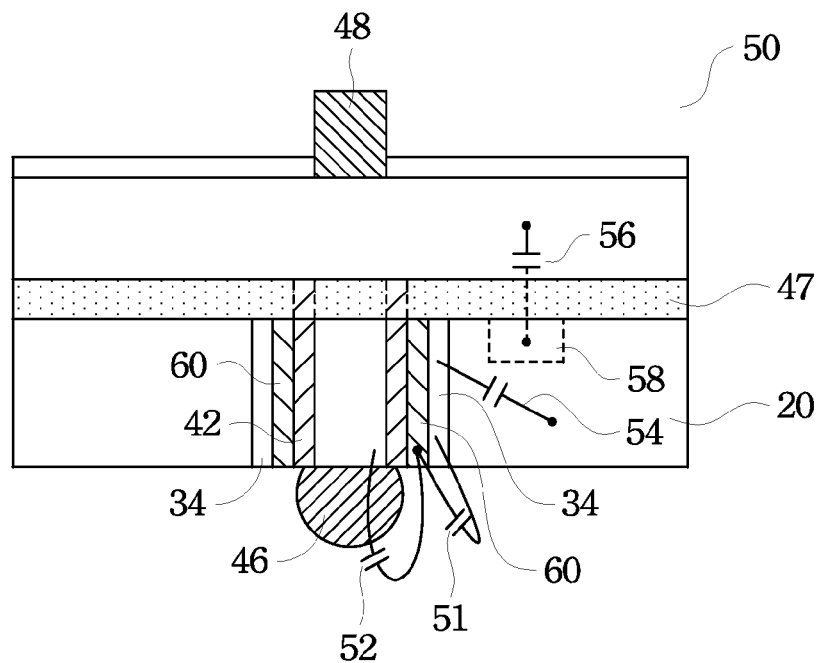

FIG. 11 illustrates the resulting chip 50 after the backside of semiconductor substrate 20 is grinded, and metal bumps 46 and 48 are formed on the respective backside and front side of chip 50. It is observed that at the time chip 50 is used, even if a plurality of thermal processes has been performed, n-well region 34 and p-type well region 60 still form enclosed rings/pipes encircling TSV 44 and isolation layer 42. Further, each of well region 34 and p-type well region 60 extends from front surface 20a to back surface 20b of semiconductor substrate 20.

Similarly, semiconductor substrate 20 may be electrically grounded or electrically floating. In either embodiment, capacitors are formed and connected in series, and the signal and noise coupling between TSV 44 and semiconductor substrate 20 is reduced compared to if no n-well region 34 and p-type well region 60 are formed. The resulting capacitors, in addition to capacitors 52 and 54, may also include junction capacitor 51 formed between p-type well region 60 and n-type well region 34. In the embodiment wherein semiconductor substrate 20 is electrically floating (not grounded), capacitor 56 may further be formed in chip 50 through, for example, P+ region 58 that is formed in semiconductor substrate 20. The details of capacitor 56 may be essentially the same as in the first embodiment, and hence are not repeated herein.

Figure 12:
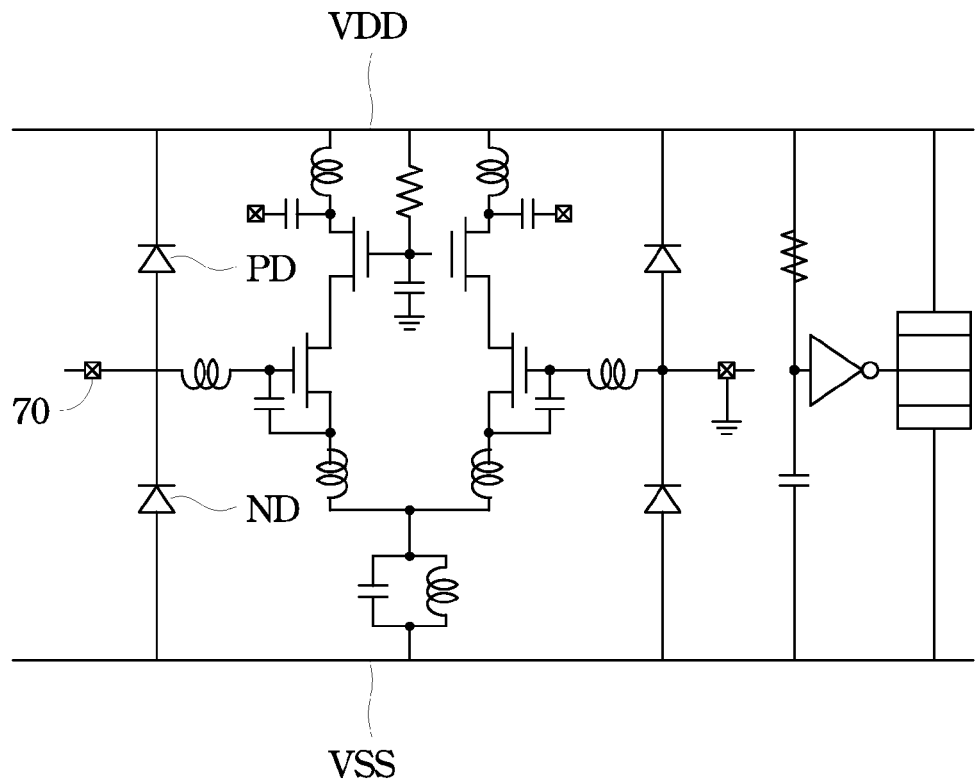
FIG. 12 illustrates an electro-static discharge (ESD) circuit formed using the embodiments shown in FIGS. 7 and 11.

The embodiments shown in FIGS. 2 through 11 may also be used to form electro-static discharge (ESD) devices. FIG. 12 illustrates an exemplary circuit including an ESD discharge path, which further includes diodes PD and ND. The ESD transient on signal input pad 70 may be discharged to node VDD through diode PD or to node VSS through diode ND. Node 70 is connected to two TSVs, with the first TSV encircled an n+ region contacting/in a p-type substrate (psub) or a p-type well region (p-well), and the second TSV encircled by a p+ region contacting/in an n-type well region (n-well). The diode formed of the first TSV and the respective n+/psub or n+/p-well regions is denoted as diode ND, wherein the respective psub or p-well is connected to the VSS. The diode formed of the second TSV and the respective p+/n-well is denoted as diode PD, wherein the n-well is connected to the ground. Since TSVs are typically large, the resulting diodes PD and ND may endure high ESD currents. This saves the chip area needed for forming ESD devices.

In the embodiments, n-well regions and/or p-well regions are formed to encircle TSVs. The n-well regions/p-well regions and the TSVs thus form shielded structures that allow RF signals to propagate between the shielded doped well region and the TSVs. Accordingly, slow-wave effect occurs, and waveguides with reduced propagation loss and reduced RF coupling are formed, with the n-well regions/p-well regions acting as the external shields of the waveguides. The n+ region and psub (or n+ region and p-well region) form a junction capacitor, and hence the shielded doped well region is separated from the psub. The waveguides formed of TSVs may be used to carry high-frequency signals, while the signal and noise coupling between the TSVs and semiconductor substrates is reduced. Further, the embodiments may be used in ESD circuits without occupying chip areas.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate of a first conductivity type, wherein the semiconductor substrate comprises a first surface and a second surface opposite the first surface;
    a through-substrate via (TSV) extending from the first surface to the second surface of the semiconductor substrate; and
    a well region of a second conductivity type opposite the first conductivity type encircling the TSV, wherein the well region extends from the first surface to the second surface of the semiconductor substrate.

2. The device of claim 1 further comprising an isolation layer encircling the TSV, wherein the well region encircles and contacts the isolation layer.

3. The device of claim 1, wherein the first conductivity type is p-type, and the second conductivity type is n-type, and wherein the well region is an n-well region.

4. The device of claim 3, wherein the n-well region and the semiconductor substrate form a diode of an electro-static discharge (ESD) circuit, and wherein the n-well region is connected to a signal input pad of the ESD circuit, and the semiconductor substrate is connected to a VSS node of the ESD circuit.

5. The device of claim 1 further comprising:
    a heavily doped region of the first conductivity type in the semiconductor substrate, wherein a distance between the heavily doped region and the well region is less than about 1 µm; and
    a capacitor coupled to the heavily doped region.

6. A device comprising:
    a p-type semiconductor substrate;
    a through-substrate via (TSV) in the p-type semiconductor substrate;
    an isolation layer encircling the TSV; and
    an n-well region encircling the isolation layer, wherein the n-well region is between and contacting the isolation layer and the p-type semiconductor substrate, and wherein an entirety of the isolation layer is physically spaced apart from the p-type semiconductor substrate.

7. The device of claim 6, wherein the p-type semiconductor substrate comprises a first side and a second side opposite the first side, and wherein each of the TSV, the isolation layer, and the n-well region extends from the first side to the second side of the semiconductor substrate.

8. The device of claim 6, wherein the n-well region and the p-type semiconductor substrate form a diode of an electro-static discharge (ESD) circuit, and wherein the n-well region is connected to a signal input pad of the ESD circuit, and the p-type semiconductor substrate is connected to a VSS node of the ESD circuit.

9. The device of claim 6 further comprising:
    a heavily doped p-type region in the p-type semiconductor substrate, wherein a distance between the heavily doped p-type region and the n-well region is less than about 1 µm; and
    a capacitor coupled to the heavily doped p-type region.

10. A device comprising:
    a semiconductor substrate of a first conductivity type, wherein the semiconductor substrate comprises a first surface and a second surface opposite the first surface;
    a through-substrate via (TSV) extending from the first surface to the second surface of the semiconductor substrate; and
    a well region of a second conductivity type opposite the first conductivity type encircling the TSV, wherein the well region extends from the first surface to the second surface of the semiconductor substrate;
    a heavily doped region of the first conductivity type in the semiconductor substrate, wherein a distance between the heavily doped region and the well region is less than about 1 µm; and
    a capacitor coupled to the heavily doped region.

11. The device of claim 10, wherein the well region and the semiconductor substrate form a diode of an electro-static discharge (ESD) circuit, and wherein the well region is connected to a signal input pad of the ESD circuit, and the semiconductor substrate is connected to a VSS node of the ESD circuit.

* * * * *